(12) United States Patent
Yates et al.

(10) Patent No.: US 6,867,148 B2
(45) Date of Patent: Mar. 15, 2005

(54) REMOVAL OF ORGANIC MATERIAL IN INTEGRATED CIRCUIT FABRICATION USING OZONATED ORGANIC ACID SOLUTIONS

(75) Inventors: Donald L. Yates, Boise, ID (US); Paul A. Morgan, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 09/858,980

(22) Filed: May 16, 2001

(65) Prior Publication Data

US 2002/0173156 A1 Nov. 21, 2002

(51) Int. Cl.$^7$ ............................................ H01L 21/302
(52) U.S. Cl. ...................... 438/745; 438/750; 438/753; 134/1.1; 134/1.2
(58) Field of Search ................................. 438/745, 750, 438/753, 754; 134/1.1, 1.2, 1.3; 216/86, 93; 252/79.2, 79.3, 79.4

(56) References Cited

U.S. PATENT DOCUMENTS

| | | | |
|---|---|---|---|
| 4,287,002 A | | 9/1981 | Torok |
| 4,899,767 A | | 2/1990 | McConnell et al. |
| 4,917,123 A | | 4/1990 | McConnell et al. |
| 5,087,951 A | | 2/1992 | Chance et al. |
| 5,762,779 A | | 6/1998 | Shirmizu et al. |
| 5,785,875 A | | 7/1998 | Hawthorne et al. |
| 5,833,871 A | | 11/1998 | Matsushita et al. |
| 5,911,837 A | | 6/1999 | Matthews |
| 5,939,336 A | | 8/1999 | Yates |
| 5,972,236 A | * | 10/1999 | Tanaka et al. ................ 216/86 |
| 6,012,469 A | | 1/2000 | Li et al. |
| 6,017,827 A | | 1/2000 | Morgan et al. |
| 6,032,682 A | | 3/2000 | Verhaverbeke |
| 6,076,229 A | | 6/2000 | Berglund |
| 6,080,531 A | | 6/2000 | Carter et al. |
| 6,090,721 A | | 7/2000 | Yates |
| 6,103,680 A | * | 8/2000 | Honda et al. ................ 510/178 |
| 6,117,351 A | | 9/2000 | Li et al. |
| 6,127,279 A | * | 10/2000 | Konuma ...................... 438/745 |
| 6,136,767 A | | 10/2000 | Hineman et al. |
| 6,146,467 A | | 11/2000 | Takaishi et al. |
| 6,162,738 A | | 12/2000 | Chen et al. |
| 6,192,889 B1 | | 2/2001 | Li et al. |
| 6,230,720 B1 | * | 5/2001 | Yalamanchili et al. ........ 134/1.3 |
| 6,277,203 B1 | * | 8/2001 | Jiang et al. .................... 134/2 |
| 6,319,801 B1 | * | 11/2001 | Wake et al. ................. 438/585 |
| 6,323,169 B1 | * | 11/2001 | Abe et al. .................... 510/176 |
| 6,360,756 B1 | * | 3/2002 | Chen et al. ................. 134/95.3 |
| 6,372,150 B1 | * | 4/2002 | Wong et al. .................. 216/13 |
| 6,383,724 B1 | * | 5/2002 | Carter et al. ................. 430/329 |

FOREIGN PATENT DOCUMENTS

JP             361004232 A    *  1/1986    ................ 134/902

* cited by examiner

*Primary Examiner*—Lan Vinh
(74) *Attorney, Agent, or Firm*—Leffert Jay & Polglaze, P.A.

(57) ABSTRACT

Organic acid components are used to increase the solubility of ozone in aqueous solutions for use in removing organic materials, such as polymeric resist and/or post-etch residues, from the surface of an integrated circuit device during fabrication. Each organic acid component is preferably chosen for its metal-passivating effect. Such solutions can have significantly lower corrosion rates when compared to ozonated aqueous solutions using common inorganic acids for ozone solubility enhancement due to the passivating effect of the organic acid component.

28 Claims, 7 Drawing Sheets

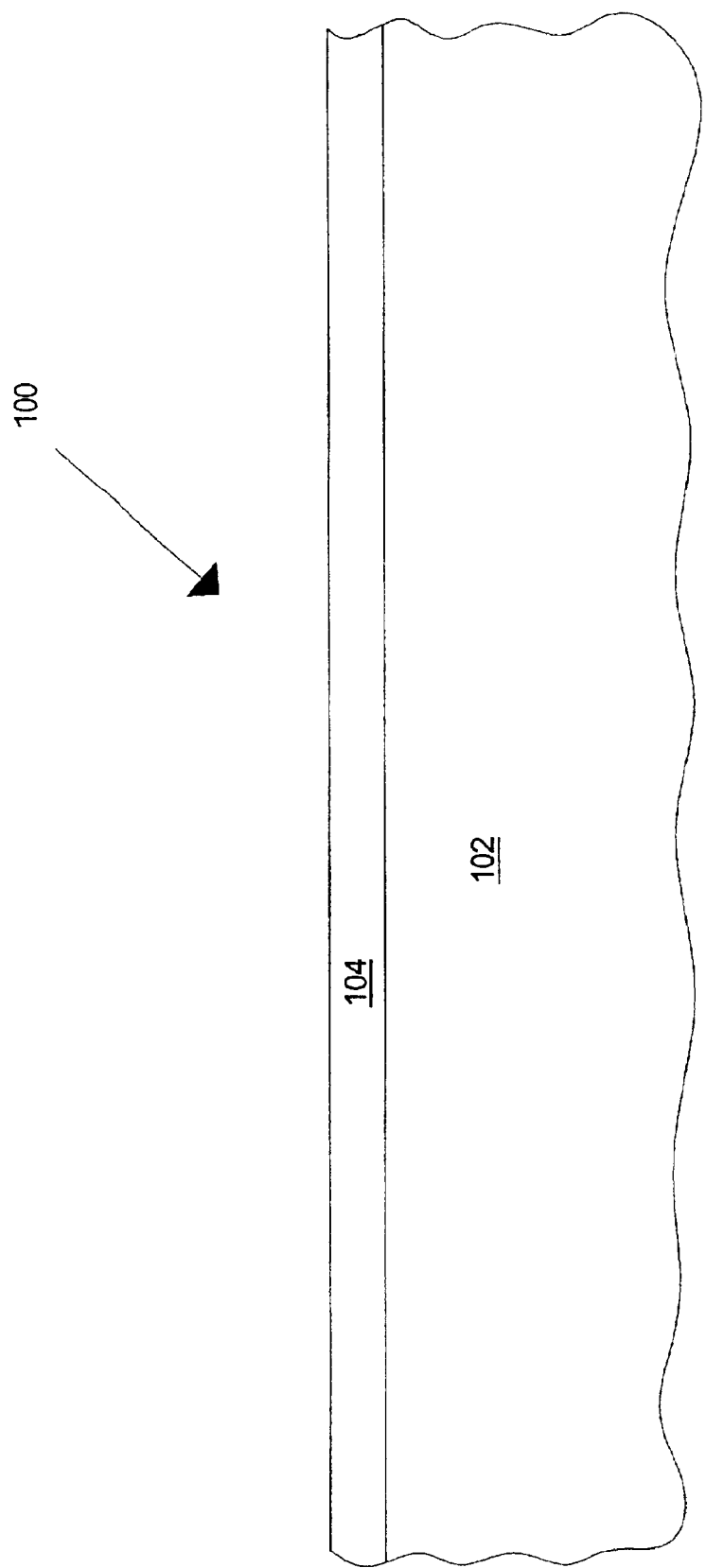

US 6,867,148 B2

REMOVAL OF ORGANIC MATERIAL IN INTEGRATED CIRCUIT FABRICATION USING OZONATED ORGANIC ACID SOLUTIONS

TECHNICAL FIELD OF THE INVENTION

The present invention relates generally to cleaning surface layers in integrated circuit fabrication, and in particular to the development of cleaning solutions and methods for the removal of organic materials from integrated circuit surface layers using ozonated organic acid solutions.

BACKGROUND OF THE INVENTION

The fabrication of integrated circuit devices generally involves a variety of patterned layers of semiconductor, insulator and conductor materials. This patterning is often carried out by a process of forming one or more thin layers of material followed by removing unwanted portions of the layers. Such removal is generally carried out by exposing portions of the layers to a liquid, gaseous or ionic etching agent to remove the exposed portions of the layers. The nature and composition of the etching agent used to remove the exposed portions of the layers is dependent upon the nature of layer to be removed as well as the nature of the surrounding layers to be retained.

In order to assure that only desired portions are removed, a photolithographic process is often used. In a photolithographic process, a photoresist layer is formed on the surface of the in-process device. The photoresist layer contains a photo-sensitive polymer whose ease of removal is altered upon exposure to light or other electromagnetic radiation. To define the pattern, the photoresist layer is selectively exposed to radiation and then developed to expose portions of the underlying layer to be removed. In practice, a mask is placed between the photoresist layer and a light source or other radiation source. The mask contains a pattern of opaque and transparent sections to selectively block or transmit the radiation. In a positive resist system, the portions of the photoresist layer exposed to the radiation are photosolubilized and the mask is designed to block the radiation from those portions of the photoresist layer that are to remain after developing. In a negative resist systems, the portions of the photoresist layer exposed to the radiation are photopolymerized and the mask is designed to block the radiation from those portions of the photoresist layer that are to be removed by developing.

After developing the photoresist layer, the exposed portions of the underlying layer are removed and then the photoresist layer itself and other post-etch residues are removed. One method for removing or "stripping" such post-etch residues includes contacting the residue with an ozonated aqueous solution. Ozonated aqueous solutions are generally preferred over ashing systems and other solvent-based systems due to ease of use and relatively low environmental concerns. Due to the low solubility of ozone in pure water, however, the water is preferably acidified in order to increase solubility. Such acidification has been accomplished directly, such as adding an inorganic acid to the water, or indirectly, such as formation of nitric acid from nitrogen-containing byproducts in the ozone source gas. While this system is quite acceptable during the patterning of layers such as polysilicon, silicon oxides/nitrides, metal oxides/nitrides and other acid-resistant species, it can become quite problematic where the patterning exposes metal layers. These problems are largely due to the oxidative effect of the ozone and the corrosivity of the acidic solution.

For the reasons stated above, and for other reasons stated below that will become apparent to those skilled in the art upon reading and understanding the present specification, there is a need in the art for alternative methods and solutions for removing organic materials in the fabrication of integrated circuit devices.

SUMMARY

Ozonated aqueous solutions are often used to strip or remove organic material from the surface of an integrated circuit device. Organic materials typically include photoresist materials as well as post-etch residues resulting from the interaction of photoresist materials and certain processes used to remove exposed portions of layers underlying a patterned photoresist layer. While inorganic acids are often used to increase the solubility of ozone in the aqueous solution, such acids generally lead to unacceptable levels of corrosion of metal layers commonly utilized in integrated circuit fabrication. As described herein, organic acid components are used in ozonated aqueous solutions for their ability to passivate exposed metal portions of the integrated circuit device. Due to the passivating effect of the organic acid, such solutions have significantly lower corrosion rates when compared to ozonated aqueous solutions using common inorganic acids for ozone solubility enhancement. As used herein, an organic acid component is either an organic acid or a salt of an organic acid.

For one embodiment, the invention provides a method of removing organic material during fabrication of an integrated circuit device. The method includes contacting the organic material with an ozonated aqueous solution containing at least one organic acid component.

For another embodiment, the invention provides a method of removing organic material during fabrication of an integrated circuit device having an exposed metal portion. The method includes contacting the organic material with an ozonated aqueous solution containing at least one organic acid component having a passivating effect on the exposed metal surface.

For yet another embodiment, the invention provides a method of forming an integrated circuit device. The method includes forming a device layer, forming a layer of photoresist material on the device layer, patterning the photoresist layer, and removing exposed portions of the device layer. The method further includes contacting the patterned photoresist layer with an ozonated organic acid aqueous solution for a period of time effective to remove at least a portion of the patterned photoresist layer.

Further embodiments of the invention include methods and solutions of varying scope.

BRIEF DESCRIPTION OF THE DRAWINGS

FIGS. 1A–1F are cross-sectional views of a portion of an integrated circuit device at various stages of fabrication in accordance with an embodiment of the invention.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Figure 1B:
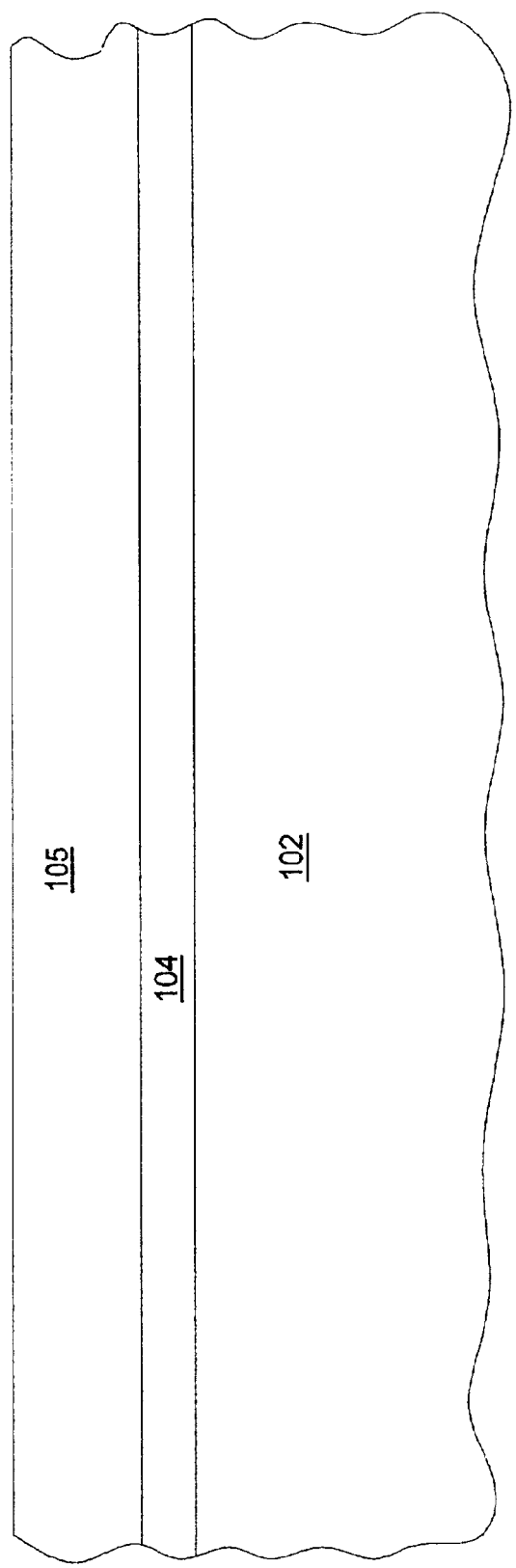

FIGS. 1A–1F show a portion of an integrated circuit device 100 at various stages of fabrication. FIG. 1A depicts a second layer of material or second device layer 104 overlying and adjoining a first layer of material or first device layer 102 in the in-process integrated circuit device 100. The device layers 102 and 104 can be any layers of material used in the fabrication of the integrated circuit device 100, such as semiconductor materials, insulator materials and conductor materials. In addition, device layers 102 and 104 may each represent multiple layers of material. As one example, the second device layer 104 may represent the layers of material to be patterned into a gate stack of a field-effect transistor overlying a semiconductor layer and may thus contain a gate dielectric layer, a polysilicon layer, a barrier layer and a metal layer. To extend the example, the first device layer 102 may represent the semiconductor layer underlying the future gate stack, such as a monocrystalline silicon substrate. In addition, the device layers 102 and 104 may have regions, contacts, interconnects, junctions or the like formed therein and thus need not be continuous, single-composition layers. In general, the second device layer 104 is the layer to be patterned while the first device layer 102 is the stopping layer or the layer to be retained.

In FIG. 1B, a photoresist layer 105 is formed on the uppermost device layer 104. The photoresist layer 105 is a photosensitive polymeric material and is generally dispensed on a spinning substrate in liquid form to produce a highly planar layer. The material is then cured to remove excess solvents and produce a highly viscous or semi-solid layer.

Figure 1C:
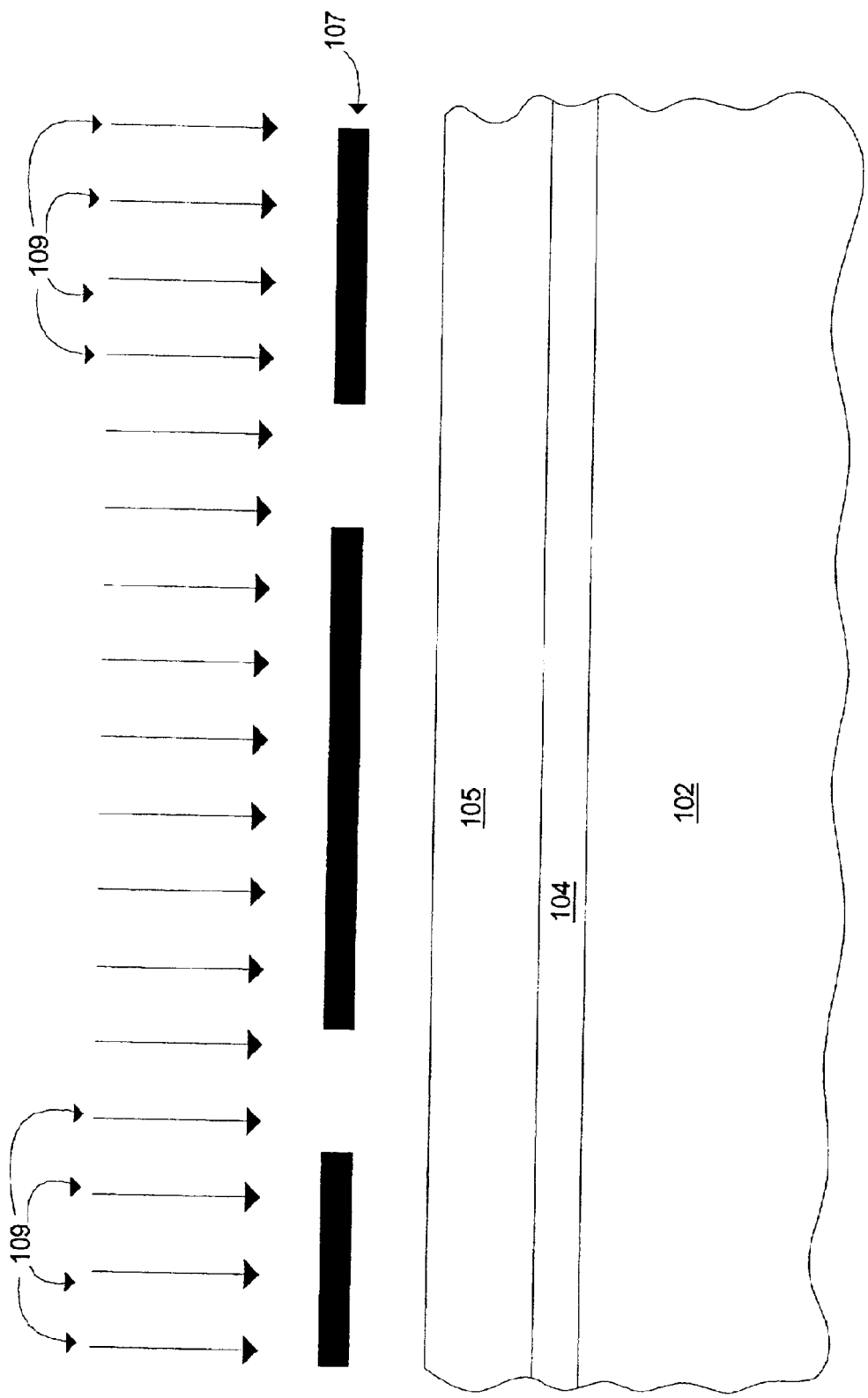

In FIG. 1C, a mask 107 is used to define the pattern and portions of the photoresist layer 105 are exposed to radiation 109. The example shown in FIG. 1C is that of a positive resist system where the portions of the photoresist layer 105 exposed to the radiation 109 are photosolubilized. In a positive resist system, the mask 107 blocks the radiation 109 from those portions of the photoresist layer 105 that are to remain after developing. Negative resist systems are also known where the portions of the photoresist layer 105 exposed to radiation 109 are photopolymerized. In a negative resist system, the mask 107 blocks the radiation 109 from those portions of the photoresist layer 105 that are to be removed by developing and obvious changes need to be made to mask 107 to produce the same pattern.

Figure 1D:
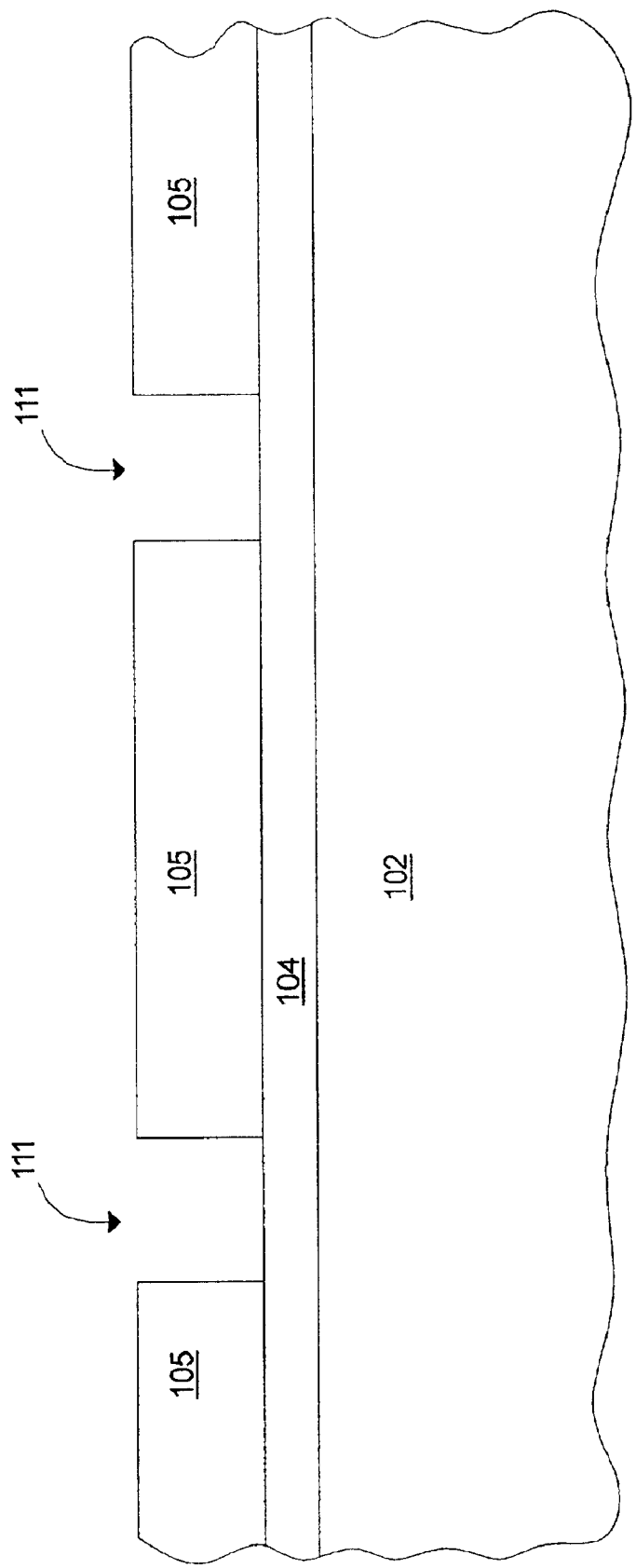
Figure 1E:
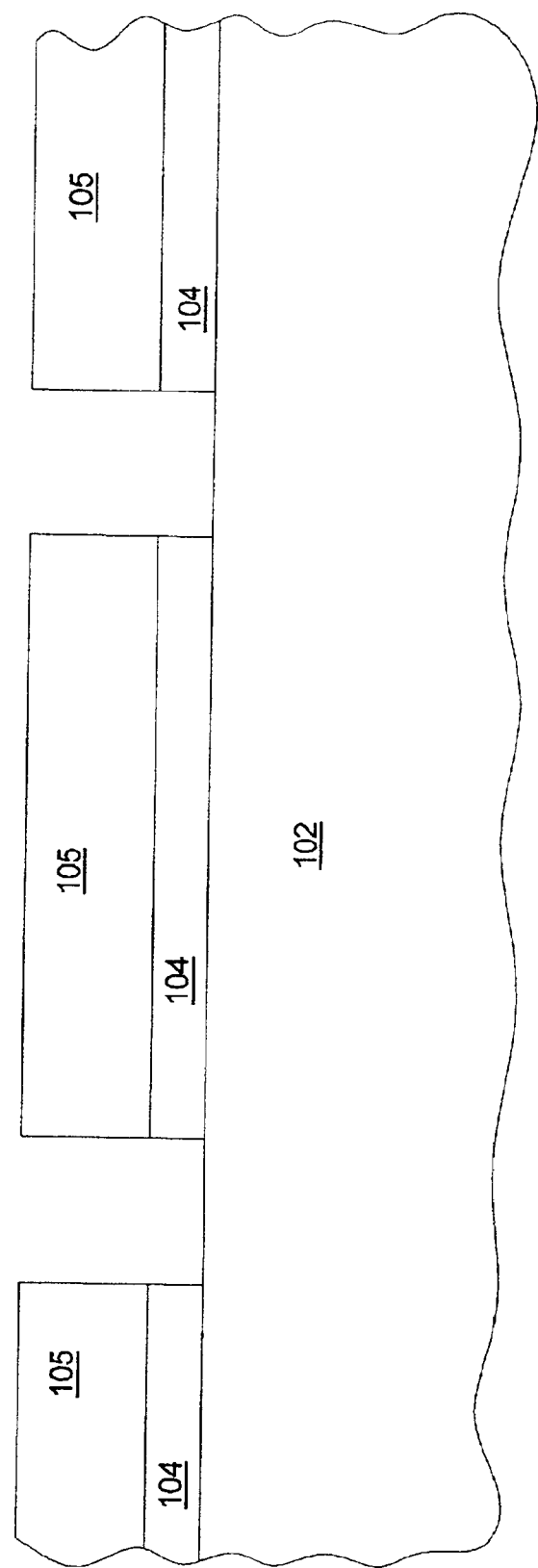

FIG. 1D shows the changes to the photoresist layer 105 after developing. As shown in FIG. 1D, the patterned photoresist layer 105 exposes portions 111 of the uppermost device layer 104. These exposed portions 111 are then removed as shown in FIG. 1E. Removal of the exposed portions 111 of the layer 104 may include chemical etching, reactive ion etching or other removal techniques. It is noted that certain removal processes, e.g., ion etch processes or other dry etch processes, may leave a residue (not shown) on exposed sidewalls of the device layer 104 and exposed portions of the device layer 102.

Figure 1F:
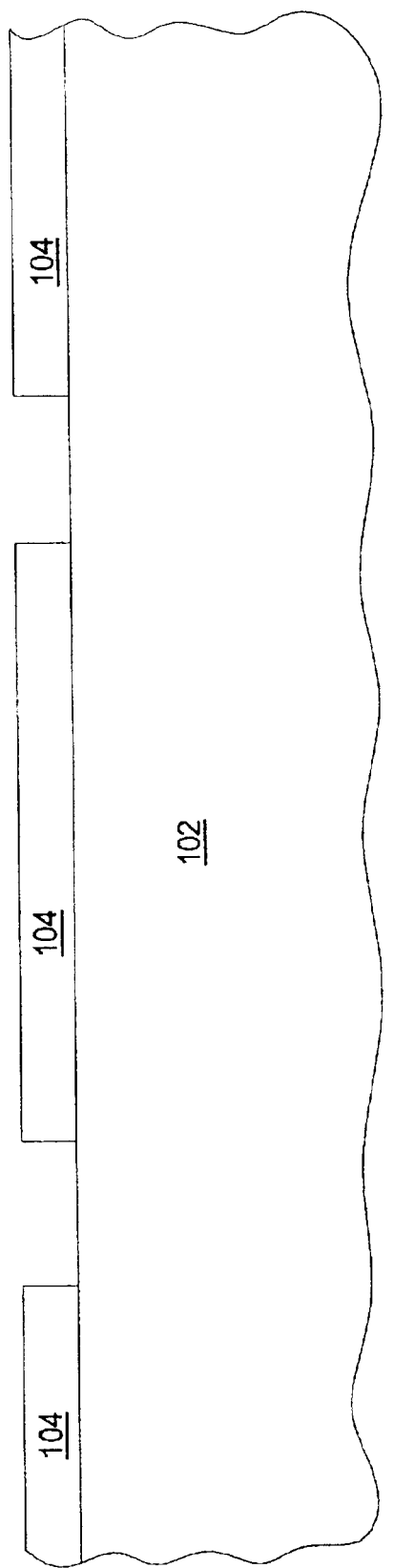

In FIG. 1F, the photoresist layer 105 is removed by contacting the polymeric resist with an ozonated stripping solution. Alternatively, or concurrently, post-etch residue produced during the removal of the exposed portions 111 of the layer 104 may be removed by contacting the residue with the ozonated stripping solution. The ozonated stripping solution is an ozonated organic acid aqueous solution in accordance with the invention. In comparison to the ozonated aqueous solutions containing inorganic acids, ozonated organic acid aqueous solutions in accordance with the invention can be substantially non-corrosive to typical metals used in integrated circuit fabrication. Examples of such metals include aluminum (Al), copper (Cu), tantalum (Ta), cobalt (Co) and iron (Fe). The ozonated organic acid aqueous solutions of the various embodiments are particularly beneficial where device layers 102 and 104 contain metal or metal layers that are exposed (such as exposed sidewalls of device layer 104 or the exposed surface of device layer 102 in FIG. 1E) during removal of the photoresist layer 105. Exposed metal portions may further include structures other than device layers 102 and 104, such as metal alignment bars or other metal registration marks (not shown) located on a periphery of the integrated circuit device or a periphery of the supporting semiconductor wafer.

Organic acids have been shunned as ozone solubility enhancers in semiconductor fabrication due to their reactivity with ozone and the lack of an identified benefit over the use of inorganic acids. However, as disclosed herein, ozonated aqueous organic acid solutions, and particularly ozonated aqueous citric acid solutions, are relatively stable at low concentration despite their reactivity. Such ozonated solutions have been identified for the decontamination of nuclear reactor systems with respect to the removal of acid-insoluble radioactive metal oxide deposits using a 5-hour treatment period. See, e.g., U.S. Pat. No. 4,287,002 issued Sep. 1, 1981 to Torok. Torok does not identify use of citric acid as an ozone solubility enhancer, but instead appears to use it as a decontamination reagent for solubilizing surface metal oxides rendered more soluble through oxidation by the dissolved ozone.

Due to their reactivity, it is recognized that the use of organic acid components to adjust solution pH can result in a reduction in ozone solubility of 15–18% compared to the use of inorganic acids such as nitric acid. Reduction of ozone solubility reduces the oxidation effect of the ozonated solution with a resulting reduction in removal rates of organic materials. However, carboxylic acids and other organic acids can provide a passivating effect on many metals to inhibit corrosion thus allowing longer contact times without attendant corrosion found with typical low-pH ozonated aqueous solutions. Examples of carboxylic acids include acetic acid, citric acid, lactic acid and malic acid. Ascorbic acid is an example of a non-carboxylic organic acid for use with the various embodiments. The salts of the organic acids can also be used to produce ozonated organic acid solutions in accordance with the invention. In particular, ammonium salts of the organic acids can be especially beneficial as they produce self-buffered solutions.

Ozonated organic acid aqueous solutions of the various embodiments are acidic, i.e., have a pH of less than 7. The solutions may contain one or more organic acid components, e.g., a mixture of two or more different organic acids or a mixture of an organic acid and a salt of the organic acid. For one embodiment, the ozonated organic acid aqueous solution contains approximately 1 to 5 wt % organic acid components in an aqueous solvent. For another embodiment, the ozonated organic acid aqueous solution contains approximately 3 wt % organic acid components in an aqueous solvent. For a further embodiment, the ozonated organic acid aqueous solution has an amount of organic acid components effective to provide a pH of approximately 2 to 6. For a still further embodiment, the ozonated organic acid aqueous solution has an amount of organic acid components effective to provide a pH of approximately 3.5. For yet another embodiment, the ozonated organic acid aqueous solution contains approximately 1 part by volume of 50 wt % citric acid to 14 parts by volume of an aqueous solvent.

Buffered acid solutions are preferably prepared having a pH near one of the pK values for the acid components. Accordingly, for additional embodiments, the ozonated organic acid aqueous solutions are buffered solutions containing an amount of an organic acid effective to produce a pH value near a pK value for the organic acid. As an example, the pK values for citric acid have been reported to be 3.15, 4.50 and 5.75 such that a buffered solution would have an amount of citric acid effective to produce a pH value near 3.15, 4.50 or 5.75.

Solutions can be prepared in a batch or continuous fashion. Solutions can further be prepared using anhydrous forms of organic acid or aqueous solutions having a concentration of the organic acid higher than the desired concentration in the final solution. In addition, the ozone may be dissolved into solution prior to use or the ozone may be added continuously or intermittently during use.

The aqueous solvent may consist essentially of water. As is typical in integrated circuit fabrication, the solvent should be free of contaminants that could impart defects into the fabrication process. Accordingly, the solvent may consist essentially of deionized (DI) water or water that has been purified to remove suspended and dissolved contaminants. Purification of the water may include distilling the water or filtering the water and passing it through one or more ion exchange beds or columns. In addition to water, the aqueous solvent or the ozonated organic acid aqueous solutions of the various embodiments may contain additional chemical components that do not materially affect the basic and novel properties of the solutions disclosed herein. Some examples include dyes, lubricants, stabilizers, buffering agents, surfactants, thickening agents, dissolved oxygen and dissolved inert gases.

As is well understood in the art, aqueous solutions may be ozonated using a variety of techniques. See, e.g., U.S. Pat. No. 6,017,827 issued Jan. 25, 2000 to Morgan et al. and commonly assigned. In general, a solution may be ozonated by contacting the solution and a gas containing ozone to dissolve the ozone into the solution. Contacting is enhanced by increasing the ratio of surface area to volume and may be accomplished using diffusers, dispersers, spargers, static mixers, packed columns and other gas-liquid contacting devices. As the solubility of ozone is increased with pH values adjusted below 7, it is preferable that the aqueous solution be adjusted to a pH value below 7 prior to contacting the solution with the gas containing ozone.

Temperature also affects ozone solubility. Cooler solution temperatures generally lead to increased dissolved ozone concentrations and a reduction in ozone decomposition rates. The solution is preferably kept at a temperature above a freezing point of the solution and below a boiling point of the solution. For one embodiment, the solution is kept at a temperature of approximately 30° C.

The oxidizing effect is generally increased at increasing levels of ozone. Accordingly, for one embodiment the ozonated organic acid aqueous solution is saturated with ozone. Concentrations of 50 ppm to 150 ppm or more are attainable. Alternatively, the ozonated organic acid aqueous solutions may contain an amount of ozone less than its saturation point, albeit with an associated reduction in oxidation effect. For another embodiment, the ozonated organic acid aqueous solution contains between approximately 5 ppm and 15 ppm of dissolved ozone.

For removal, the organic material is wetted with an ozonated organic acid aqueous solution of the various embodiments. Wetting is accomplished by contacting the surface of the integrated circuit device with the solution. Such contacting can include spray systems used to spray the solution onto the device and the material to be removed, immersion or dip systems used to immerse the device and the material to be removed into the solution, and nebulizing or atomizing systems used to develop a mist of the solution for condensing onto the device and the material to be removed. Spray systems, immersion systems and nebulizing systems are well known in the art. Other methods can be envisioned for exposing the device and the material to be removed to the solution, e.g., flowing a stream of solution over the surface of the device.

Mechanical action may be used to assist the removal of materials from the surface of the integrated circuit device during fabrication. Example types include rotation or other movement of the substrate containing the integrated circuit device while applying or contacting the solution; circulation and/or recirculation of the solution within an immersion bath; brush scrubbing of the device surface; and/or sonic vibration, such as ultrasonics or megasonics. Mechanical action can include more than one type of action, e.g., mechanical action may include using megasonics in a recirculating immersion bath.

The surface of the integrated circuit device is preferably wetted or in contact with the ozonated organic acid aqueous solution for a period of time effective to remove at least a portion of the organic material. For one embodiment, the organic material is in contact with the ozonated organic acid aqueous solution for a period of time effective to remove substantially all of the organic material. For a further embodiment, the removal process extends to a time where the cost of additional removal does not warrant its corresponding marginal increase in device yield. For one embodiment, the surface of the integrated circuit device, and thus the organic material, is in contact with the ozonated organic acid aqueous solution for a period of time equal to approximately 1 minute for every 1000 Å of organic material to be removed.

Figure 2:
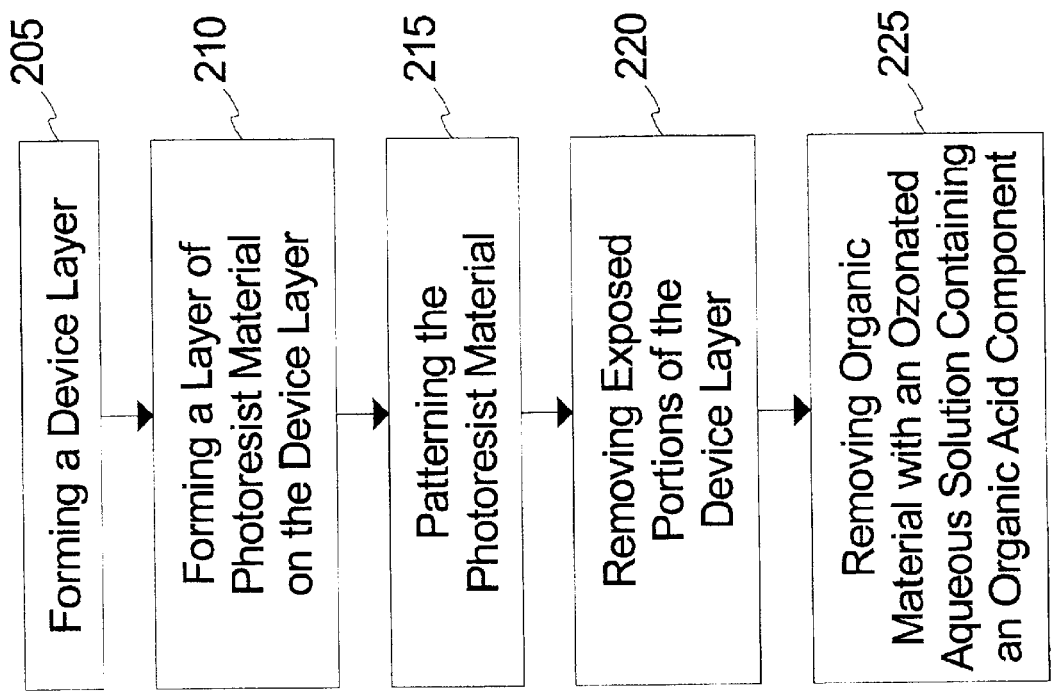
FIG. 2 is a flowchart of a portion of a process to fabricate an integrated circuit device in accordance with an embodiment of the invention.

FIG. 2 is a flowchart of a portion of a process to fabricate an integrated circuit device in accordance with one embodiment of the invention. A device layer is formed in action box 205. The device layer may be any layer contained in the finished integrated circuit device to be patterned as an entity as described with reference to FIG. 1A. Accordingly, the device layer may contain one or more layers of material.

In action box 210, a layer of photoresist material is formed on the device layer as described with reference to FIG. 1B. The photoresist material is then patterned in action box 215 as described with reference to FIGS. 1C–1D. Following patterning of the photoresist material, exposed portions of the device layer are removed in action box 220 as described with reference to FIG. 1E. Organic material is then removed in action box 225 using an ozonated aqueous solution containing an organic acid as described with reference to FIG. 1F. The organic material may include the photoresist material and/or post-etch residue.

As typical integrated circuit devices contain multiple patterned layers, the process described in FIG. 2 may be repeated for additional device layers within the integrated circuit device. In addition, earlier or subsequent processing may occur involving the removal of other organic materials that does not make use of an ozonated aqueous solution containing an organic acid. For example, post-etch residue may be removed using an organic solvent prior to removal of the photoresist material using an ozonated organic acid aqueous solution.

The foregoing figures were used to aid the understanding of the accompanying text. However, the figures are not drawn to scale and relative sizing of individual features and layers are not necessarily indicative of the relative dimensions of such individual features or layers in application. Accordingly, the drawings are not to be used for dimensional characterization.

Conclusion

Ozonated aqueous solutions are often used to remove organic material from the surface of an integrated circuit device. Organic materials typically include photoresist materials as well as post-etch residues resulting from the interaction of photoresist materials and certain processes used to remove exposed portions of layers underlying a patterned photoresist layer. While inorganic acids are often used to increase the solubility of ozone in the aqueous solution, such acids generally lead to unacceptable levels of corrosion of metal layers commonly utilized in integrated circuit fabrication. As described herein, organic acid components are used in ozonated aqueous solutions for their ability to passivate exposed metal portions of the integrated circuit device. Due to the passivating effect of the organic acid, such solutions have significantly lower corrosion rates when compared to ozonated aqueous solutions using common inorganic acids for ozone solubility enhancement.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, other deposition techniques and removal techniques may be utilized with the invention and the invention can be used in conjunction with a variety of integrated circuit devices. Accordingly, this application is intended to cover any adaptations or variations of the invention. It is manifestly intended that this invention be limited only by the following claims and equivalents thereof.

What is claimed is:

1. A method of removing a patterned photoresist layer during fabrication of an integrated circuit device, the method comprising:
    contacting the patterned photoresist layer with an ozonated aqueous solution containing at least one organic acid component to remove at least a portion of the patterned photoresist layer;
    wherein the ozonated aqueous solution consists essentially of water, dissolved ozone and the at least one organic acid component; and
    wherein the at least one organic acid component includes citric acid or a salt of citric acid.

2. The method of claim 1, wherein the ozonated aqueous solution contains an amount of organic acid components effective to produce a pH value of approximately 3.5.

3. The method of claim 1, wherein the ozonated aqueous solution contains an amount of organic acid components effective to produce a pH value of approximately 3.15.

4. The method of claim 1, wherein the ozonated aqueous solution contains approximately 1 to 5 wt % of citric acid or a salt of citric acid.

5. The method of claim 1, wherein the ozonated aqueous solution contains approximately 3 wt % of citric acid or a salt of citric acid.

6. The method of claim 1, wherein the ozonated aqueous solution is saturated with ozone.

7. The method of claim 1, wherein the ozonated aqueous solution contains approximately 5 ppm to 15 ppm dissolved ozone.

8. The method of claim 1, wherein ozone is added to the ozonated aqueous solution prior to use.

9. A method of removing a patterned photoresist layer from a surface of an integrated circuit device during fabrication, the method comprising:
    wetting the surface of the integrated circuit device with an ozonated citric acid aqueous solution for a period of time to remove at least a portion of the patterned photoresist layer;
    wherein the ozonated citric acid aqueous solution consists essentially of water, dissolved ozone and citric acid and/or its salts.

10. The method of claim 9, wherein wetting the surface of the integrated circuit device with an ozonated citric acid aqueous solution further comprises spraying the ozonated citric acid aqueous solution onto the surface of the integrated circuit device.

11. The method of claim 10, further comprising brushing the surface of the integrated circuit device while spraying the ozonated citric acid aqueous solution.

12. A method of forming an integrated circuit device, comprising:
    forming a device layer;
    forming a layer of photoresist material on the device layer;
    patterning the photoresist layer, thereby exposing portions of the device layer;
    removing the exposed portions of the device layer; and
    contacting the patterned photoresist layer with an ozonated organic acid aqueous solution for a period of time effective to remove at least a portion of the patterned photoresist layer;
    wherein the ozonated organic acid aqueous solution consists essentially of water, dissolved ozone and one or more organic acid components; and
    wherein the one or more organic acid components contains at least one of citric acid and a salt of citric acid.

13. The method of claim 12, wherein the ozonated organic acid aqueous solution further comprises at least one chemical component selected from the group consisting of dyes, lubricants, stabilizers, buffering agents, surfactants, thickening agents, dissolved oxygen and dissolved inert gases.

14. The method of claim 12, wherein the one or more organic acid components are selected from the group consisting of acetic acid, ascorbic acid, citric acid, lactic acid and malic acid.

15. The method of claim 12, wherein the period of time effective to remove at least a portion of the patterned photoresist layer is a period of time effective to remove substantially all of the patterned photoresist layer.

16. The method of claim 12, wherein the period of time effective to remove at least a portion of the patterned photoresist layer extends to a time where a cost of additional removal does not warrant its corresponding marginal increase in device yield.

17. The method of claim 12, wherein the period of time effective to remove at least a portion of the patterned photoresist layer is approximately 1 minute for every 1000 Å thickness of the patterned photoresist layer.

18. The method of claim 12, further comprising:
forming a residue during removing the exposed portions of the device layer; and
contacting the residue with an ozonated organic acid aqueous solution for a period of time effective to remove at least a portion of the residue.

19. The method of claim 12, wherein the one or more organic acid components are selected from the group consisting of organic acids and salts of organic acids.

20. The method of claim 19, wherein at least one organic acid component is an ammonium salt of an organic acid.

21. A method of removing a patterned photoresist layer from a surface of an integrated circuit device during fabrication, the method comprising:
contacting the patterned photoresist layer with an ozonated aqueous solution consisting essentially of water, dissolved ozone and citric acid.

22. A method of forming an integrated circuit device, comprising:
forming a device layer;
forming a layer of photoresist material on the device layer;
patterning the photoresist layer, thereby exposing portions of the device layer;
removing the exposed portions of the device layer; and
contacting the patterned photoresist layer with an ozonated organic acid aqueous solution for a period of time effective to remove at least a portion of the patterned photoresist layer;
wherein the ozonated organic acid aqueous solution consists essentially of water, dissolved ozone and one or more organic acid components selected from the group consisting of organic acids and salts of organic acids; and
wherein the one or more organic acid components include at least one of citric acid and a salt of citric acid.

23. A method of forming an integrated circuit device, comprising:
forming a device layer;
forming a layer of photoresist material on the device layer;
patterning the photoresist layer, thereby exposing portions of the device layer;
removing the exposed portions of the device layer; and
contacting the patterned photoresist layer with an ozonated organic acid aqueous solution for a period of time effective to remove at least a portion of the patterned photoresist layer;
wherein the ozonated organic acid aqueous solution consists essentially of water, dissolved ozone and one or more organic acid components selected from the group consisting of acetic acid, ascorbic acid, citric acid, lactic acid, malic acid and their salts; and
wherein the one or more organic acid components includes at least citric acid or its salt.

24. A method of forming an integrated circuit device, comprising:
forming a device layer;
forming a layer of photoresist material on the device layer;
patterning the photoresist layer, thereby exposing portions of the device layer;
removing the exposed portions of the device layer; and
contacting the patterned photoresist layer with an ozonated aqueous citric acid solution for a period of time effective to remove at least a portion of the patterned photoresist layer;
wherein the ozonated aqueous citric acid solution consists essentially of water, dissolved ozone and citric acid or a salt of citric acid.

25. A method of forming an integrated circuit device, comprising:
forming a second device layer on a first device layer;
forming a layer of photoresist material on the second device layer;
patterning the photoresist layer, thereby exposing portions of the second device layer;
removing the exposed portions of the second device layer to expose portions of the first device layer; and
removing at least a portion of the patterned photoresist layer by contacting the patterned photoresist layer with an ozonated organic acid aqueous solution;
wherein the integrated circuit device contains metal exposed to the ozonated organic acid aqueous solution while removing at least the portion of the patterned photoresist layer; and
wherein the ozonated organic acid aqueous solution consists essentially of water, dissolved ozone and one or more organic acid components selected from the group consisting of acetic acid, ascorbic acid, citric acid, lactic acid, malic acid and their salts; and
wherein the one or more organic acid components includes at least citric acid or its salt.

26. A method of forming an integrated circuit device, comprising:
forming a second device layer on a first device layer;
forming a layer of photoresist material on the second device layer;
patterning the photoresist layer, thereby exposing portions of the second device layer;
removing the exposed portions of the second device layer to expose portions of the first device layer; and
removing at least a portion of the patterned photoresist layer by contacting the patterned photoresist layer with an ozonated aqueous citric acid solution consisting essentially of water, dissolved ozone and citric acid and/or its salts;
wherein the integrated circuit device contains metal exposed to the ozonated aqueous citric acid solution while removing at least the portion of the patterned photoresist layer.

27. A method of removing organic material during fabrication of an integrated circuit device, the method comprising:
contacting the organic material with an ozonated aqueous solution consisting essentially of water, dissolved ozone and at least one organic acid component;

wherein each at least one organic acid component is selected from the group consisting of salts of organic acids; and wherein at least one salt of organic acid is a salt of citric acid.

28. A method of removing organic material during fabrication of an integrated circuit device, the method comprising:

contacting the organic material with an ozonated aqueous solution consisting essentially of water, dissolved ozone and at least one organic acid component;

wherein the ozonated aqueous solution contains an amount of organic acid components effective to produce a pH value of approximately 3.5.

* * * * *